(12) United States Patent
Joshi et al.

(10) Patent No.: US 11,778,780 B2
(45) Date of Patent: Oct. 3, 2023

(54) COOLING ASSEMBLIES AND METHODS

(71) Applicant: TOYOTA MOTOR ENGINEERING & MANUFACTURING NORTH AMERICA, INC., Plano, TX (US)

(72) Inventors: Shailesh N. Joshi, Ann Arbor, MI (US); Danny J. Lohan, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 452 days.

(21) Appl. No.: 16/880,202

(22) Filed: May 21, 2020

(65) Prior Publication Data
US 2021/0368652 A1 Nov. 25, 2021

(51) Int. Cl.
*H05K 7/20* (2006.01)
*F28D 15/00* (2006.01)
*G05B 15/02* (2006.01)

(52) U.S. Cl.
CPC ......... *H05K 7/20281* (2013.01); *F28D 15/00* (2013.01); *G05B 15/02* (2013.01);
(Continued)

(58) Field of Classification Search
CPC .......... F28D 15/00; F28D 20/02; F28D 21/00; F28D 2021/0028; F28F 15/02; F28F 15/0275; F28F 13/00; F28F 13/003; F28F 21/085; H01L 21/4871; H01L 21/4882; H01L 23/31; H01L 23/34; H01L 23/46; H01L 23/427; G06F 1/20; G06F 2200/201; G05B 15/02; H05K 7/20; H05K 7/20154; H05K 7/209; H05K 7/20218; H05K 7/20254; H05K 7/20263; H05K 7/20272; H05K 7/20281; H05K 7/20309–20327; H05K 7/20336; H05K 7/20381; H05K 7/2029; H05K 7/20509; H05K 7/20663; H05K 7/20763; H05K 7/20836; H05K 7/20872; H05K 7/20881; H05K 7/20936;
(Continued)

(56) References Cited

U.S. PATENT DOCUMENTS 4,393,921 A * 7/1983 Zbinden ................. G05D 23/24
236/780
9,557,118 B2 1/2017 Salamon et al.
(Continued)

FOREIGN PATENT DOCUMENTS

WO 2017127059 A1 7/2017

*Primary Examiner* — Amir A Jalali
(74) *Attorney, Agent, or Firm* — Dinsmore & Shohl LLP (57) ABSTRACT

In various embodiments, a cooling assembly includes a heat-generating device, a metal inverse opal (MIO) layer, a shared coolant reservoir, a passive heat exchange circuit, and an active heat exchange circuit. The MIO layer is bonded to the heat-generating device. The shared coolant reservoir contains a coolant fluid. The passive heat exchange circuit directs coolant fluid from the shared coolant reservoir through the MIO layer and back to the shared coolant reservoir. The active heat exchange circuit includes a pump and a heat exchanger, wherein the active heat exchange circuit draws the coolant fluid from the shared coolant reservoir through the heat exchanger and returns the coolant fluid to the shared coolant reservoir.

20 Claims, 5 Drawing Sheets

(52) U.S. Cl.
CPC ..... *H05K 7/20263* (2013.01); *H05K 7/20272* (2013.01); *H05K 7/20872* (2013.01); *H05K 7/20927* (2013.01); *H05K 7/20945* (2013.01)

(58) Field of Classification Search
CPC ........... H05K 7/20927; H05K 7/20945; G05D 23/00; G01K 13/02
See application file for complete search history.

(56) References Cited

U.S. PATENT DOCUMENTS

| | | |
|---|---|---|
| 10,347,601 B1 | 7/2019 | Dede et al. |
| 10,515,871 B1 | 12/2019 | Joshi et al. |
| 10,679,923 B1 * | 6/2020 | Joshi ..................... F28D 20/023 |
| 2006/0289148 A1 * | 12/2006 | Wei .................... H05K 7/20281 |
| | | 165/104.31 |
| 2016/0315491 A1 * | 10/2016 | Zhou .................... H01M 14/00 |
| 2017/0260889 A1 * | 9/2017 | Zhou ....................... F02B 39/12 |
| 2018/0312034 A1 * | 11/2018 | Koberstein ........ B60H 1/00271 |
| 2019/0239395 A1 | 8/2019 | Joshi et al. |
| 2021/0161026 A1 * | 5/2021 | Joshi .................... H01L 23/473 |

* cited by examiner

COOLING ASSEMBLIES AND METHODS

TECHNICAL FIELD

The present specification generally relates to cooling assemblies and methods, and, more specifically, cooling assemblies and methods for cooling a heat-generating device.

BACKGROUND

As background, metal-inverse-opal (MIO) structures are defined by a network of small voids within a metal layer. Such MIO structures may be used as a bond layer to bond an electronic device to a substrate. MIO structures may be advantageous due to their flexibility, and also that coolant fluid may be passed through the network of voids to further cool the electronic device. However, the small size of the voids cause large pressure drops when pumping coolant fluid through the MIO structure. Such pressure drops may lead to cooling and energy consumption inefficiencies.

Accordingly, a need exists for alternative cooling assemblies and methods for cooling a heat-generating device that reduce or mitigate system pressure drops.

SUMMARY

In one embodiment, a cooling assembly includes a heat-generating device, a metal inverse opal (MIO) layer, a shared coolant reservoir, a passive heat exchange circuit, and an active heat exchange circuit. The MIO layer is bonded to the heat-generating device. The shared coolant reservoir contains a coolant fluid. The passive heat exchange circuit directs coolant fluid from the shared coolant reservoir through the MIO layer and back to the shared coolant reservoir. The active heat exchange circuit includes a pump and a heat exchanger, wherein the active heat exchange circuit draws the coolant fluid from the shared coolant reservoir through the heat exchanger and returns the coolant fluid to the shared coolant reservoir.

In another embodiment, a cooling assembly includes a heat-generating device, a metal inverse opal (MIO) layer, a shared coolant reservoir, a temperature sensor, a passive heat exchange circuit, an active heat exchange circuit, and an electronic control unit. The MIO layer is bonded to the heat-generating device. The temperature sensor is configured to output a signal indicative of a temperature of the coolant fluid within the shared coolant reservoir. The passive heat exchange circuit directs coolant fluid from the shared coolant reservoir through the MIO layer and back to the shared coolant reservoir. The active heat exchange circuit includes a pump and a heat exchanger fluidically coupled to the pump, wherein the active heat exchange circuit draws the coolant fluid from the shared coolant reservoir through the heat exchanger and returns the coolant fluid to the shared coolant reservoir. The electronic control unit is configured to detect the temperature of the coolant fluid within the shared coolant reservoir based on the signal from the temperature sensor, and direct coolant fluid from the active heat exchange circuit to the shared coolant reservoir in response to the temperature of the coolant fluid within the shared coolant reservoir.

In yet another embodiment, a method of cooling a heat-generating device includes actively directing fluid through an active heat exchange circuit with a pump from a shared coolant reservoir, through a heat exchanger, and into the shared coolant reservoir, and passively directing fluid from the shared coolant reservoir through a passive heat exchange circuit such that coolant fluid is directed from the shared coolant reservoir through an MIO layer bonded to a heat generating device and back to the shared coolant reservoir.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
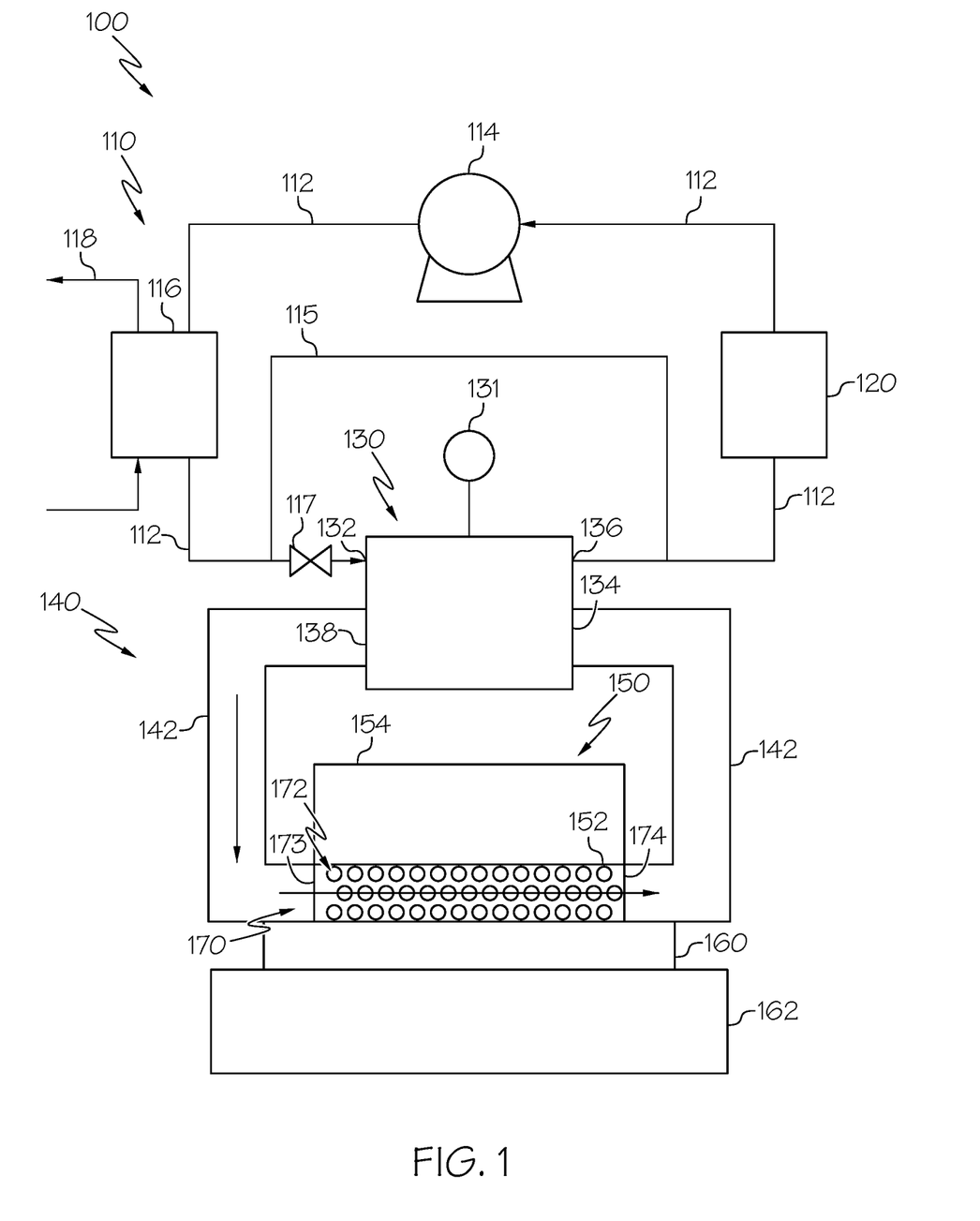
FIG. 1 schematically depicts a cooling assembly, according to one or more embodiments shown and described herein.
Figure 2:
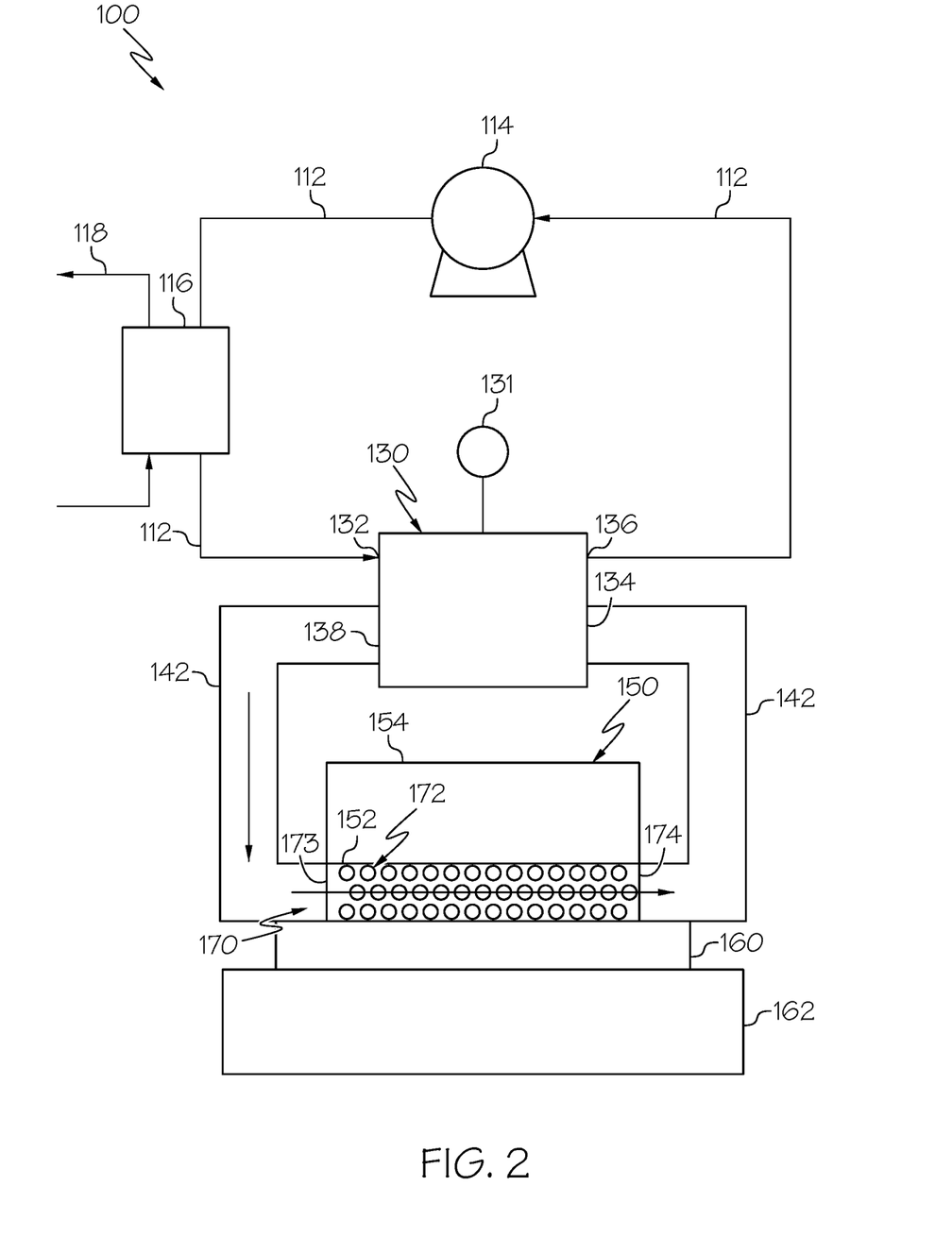
FIG. 2 schematically depicts a cooling assembly, according to one or more embodiments shown and described herein.
Figure 3:
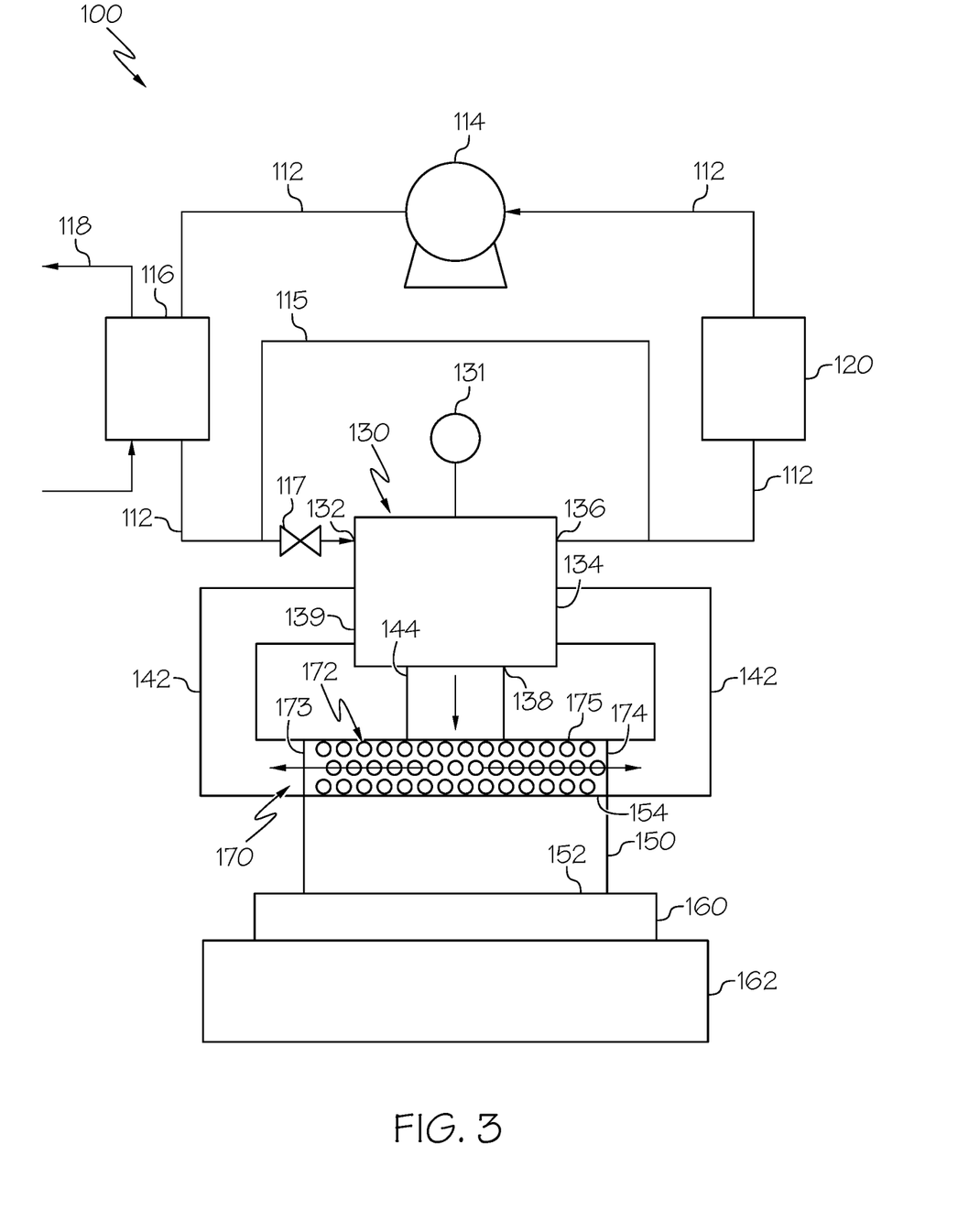
FIG. 3 schematically depicts a cooling assembly, according to one or more embodiments shown and described herein.

FIGS. 1-3 generally depict embodiments of a cooling assembly for cooling a heat-generating device. For example, cooling assemblies according to the present disclosure may include a heat-generating device, a metal inverse opal (MIO) layer, a shared coolant reservoir, a passive heat exchange circuit, and an active heat exchange circuit. The active heat exchange circuit may direct coolant fluid through the active heat exchange circuit via a pump, which replenishes coolant fluid by passing the coolant fluid through a heat exchanger. The passive heat exchange circuit may passively allow coolant to flow naturally through the MIO layer and thereafter return to the coolant reservoir, where it may be drawn into the active heat exchange circuit for cooling the coolant fluid. Accordingly, pressure drops, which may otherwise be experienced by pushing coolant fluid through an MIO layer with a pump, may be avoided, thereby increasing system cooling and energy consumption efficiencies.

It is noted that embodiments as used herein may be incorporated into vehicle systems (e.g., conventional gas powered vehicles, electronic vehicles, and/or hybrid vehicles) for providing cooling to electronic and/or other assemblies within the vehicles. Vehicles according to the present disclosure may include any terrestrial, airborne, or aquatic vehicles.

Referring now to FIGS. 1-3, various embodiments of a cooling assembly 100 are schematically depicted. Cooling assemblies 100 according to the present disclosure generally include a heat-generating device 150, an MIO layer 170, a shared coolant reservoir 130, an active heat exchange circuit 110, and a passive heat exchange circuit 140. As will be explained in greater detail below, the passive heat exchange circuit 140 may naturally allow coolant fluid to flow through the passive heat exchange circuit 140 to cool the heat-generating device 150, while the active heat exchange circuit 110 pumps coolant fluid through a heat exchanger 116 to cool the coolant fluid and replenish the shared coolant reservoir 130. Coolant fluid refers to any fluid configured to draw or remove heat from a system (e.g., from the heat-generating device 150 and/or the MIO layer 170). Non-limiting examples of the coolant fluid include dielectric coolant fluids such as aromatics, silicate-ester, aliphatics, silicones, fluorocarbons, and the like.

A heat-generating device 150 may be any device that generates heat, such as, for example, a power electronics device, semiconductor devices, or the like. Semiconductor devices may include, but are not limited to, insulated gate bipolar transistors (IGBT), metal-oxide-semiconductor field effect transistors (MOSFET), power diodes, power bipolar transistors, power thyristor devices, and the like. As an example and not a limitation, the heat-generating device 150 may be included as a component in an inverter and/or converter circuit used to provide electrical power to high load devices, such as electric motors in electrified vehicles (e.g., hybrid vehicles, plug-in hybrid electric vehicles, plug-in electric vehicles, and the like). It should be understood that the cooling assemblies 100 described herein may also be used to cool heat-generating devices other than semiconductor devices (e.g., mechanical devices, such as motors). It is noted that in some embodiments, there may be more than one heat-generating device 150, which may be cooled via the passive heat exchange circuit 140. The heat-generating device 150 may include a first surface 152 and a second surface 154 opposite the first surface 152.

The MIO layer 170 may be bonded to the heat-generating device 150 so as to be in thermal communication with the heat-generating device 150. MIO layers are porous and provide high capillary pressure for efficient cooling. In particular, MIO layers provide increased surface area to engage with a coolant fluid to facilitate heat transfer from the heat-generating device 150 to the coolant fluid to cool the heat-generating device 150. For example, the MIO layer 170 includes a plurality of networked pores 172 and/or cavities. The networked pores 172 may extend throughout the MIO layer 170 such that cooling fluid can flow through the networked pores 172 and allow heat to be exchanged between the MIO layer 170 and the coolant fluid. In embodiments, the networked pores 172 may allow coolant fluid to contact the heat-generating device 150 to allow heat to be exchanged directly from heat-generating device 150 to the coolant fluid. Each of the plurality of interconnected pores 172 generally act to increase the surface area of the MIO layer 170 that can be exposed to coolant fluid, thereby increasing the amount of thermal energy that can be transferred to the cooling fluid from the MIO layer 170. Further, geometry of the plurality of networked pores 172 may assist in nucleation of the coolant fluid, further assisting in transferring thermal energy from the MIO layer 170. For example and without being bound by theory, thermal energy is required for the coolant fluid to change phase (e.g., from a liquid phase to a solid phase, or from a liquid phase or solid phase to a supercritical phase), and accordingly, the coolant fluid may absorb significant amounts of thermal energy when changing phase from liquid to vapor. That is, the MIO layer may provide nucleation sites in the networked pores 172 to allow liquid coolant to boil and change phase from single phase liquid to vapor. By encouraging nucleation of the cooling fluid, the geometry of the plurality of networked pores 172 may assist in transferring thermal energy from the MIO layer 170 to the cooling fluid being passed through the MIO layer 170. As the MIO layer 170 is thermally coupled to the heat-generating device 150, by transferring thermal energy from the MIO layer 170 to the coolant fluid, thermal energy from the heat-generating device 150 may be dissipated by way of the MIO layer 170 through capillary movement of the coolant fluid.

While in the embodiment depicted in FIGS. 1-3, the MIO layer 170 defines pores 172 that are regularly spaced from one another it should be understood that this is merely an example and the pores 172 may be positioned at irregular intervals from one another. An MIO layer 170 may be formed in a variety of ways. For example, the MIO layer 170 may be formed by depositing metal within a sacrificial template. The sacrificial template may include, for example and not as a limitation, microspheres that are dissolved after metal deposition to leave a skeletal network of metal with a periodic arrangement of interconnected pores 172, which may or may not be etched to increase porosity and interconnection of the hollow spheres. In some embodiments, the sacrificial template may include a photoresist layer that is partially ablated with one or more lasers (e.g., holographic lithography using two or more intersecting lasers, three or more intersecting lasers, four or more intersecting lasers) to create a pattern of interconnected pores 172, which may then be electroplated. The photoresist layer may thereafter be dissolved or burned off through application of heat, leaving the skeletal network. The MIO layer 170 may be formed of any suitable metal or metal alloy, polymer, semiconductor, and may be for example, a copper inverse opal (CIO) structure, a nickel inverse opal (NIO) structure, and/or the like.

The MIO layer 170 may be bonded to the heat-generating device 150 in a number of ways. In some embodiments, the MIO layer 170 may be grown on the heat-generating device 150 and bonded to the bottom electrode 160 using, for example, using transient liquid phase (TLP) bonding and/or solder bonding. In other embodiments, soldering or brazing may be used to thermally bond the MIO layer 170 to the heat-generating device 150 and/or the bottom electrode 160. In still other embodiments, electrolytic or electroless bonding may be used bond the MIO layer 170 to the heat-generating device 150 and/or the bottom electrode 160. The MIO layer 170 may be bonded to and/or grown on either the first surface 152 of the heat-generating device 150 as illustrated in FIGS. 1 and 2, or the second surface 154 as illustrated in FIG. 3.

Referring again to FIG. 1, the assembly may further include a bottom electrode 160 configured to conduct electrical energy and/or signals to and/or from the heat-generating device 150. As illustrated in FIGS. 1 and 2, the MIO layer 170 may be positioned between the bottom electrode 160 and the heat-generating device 150 and may provide a bonding layer to bond the bottom electrode 160 to the heat-generating device 150, accordingly, the MIO layer 170 acts as both a bonding layer and a cooling medium. In such embodiments, the MIO layer 170 may be electrically conductive to allow electrical power and/or signals to be passed from the bottom electrode 160 to the heat-generating device 150 or vice versa. In other embodiments, and as illustrated in FIG. 3, the heat-generating device 150 may be positioned between the bottom electrode 160 and the MIO layer 170. For example, the MIO layer 170 may be grown on the second surface 154 of the heat-generating device 150, while a first surface 152 of the heat-generating device 150 may be bonded to the bottom electrode 160 via, e.g., TLP bonding or solder bonding. The bottom electrode 160 may be made from, for example, copper, aluminum, brass or the like.

In some embodiments, a dielectric substrate 162 may be bonded to the bottom electrode 160 opposite the MIO layer 170 and the heat-generating device 150. The dielectric substrate 162 may be, for example, a printed circuit board for supporting and electrically connecting the heat-generating device 150 to other components (e.g., a battery, sensors, processors, memories, or the like). In some embodiments the dielectric substrate 162 may instead be a Direct Bond Copper (DBC) substrate.

Referring collectively to FIGS. 1-3, each of the depicted cooling assemblies 100 includes an active heat exchange circuit 110, a passive heat exchange circuit 140, and a shared coolant reservoir 130.

The shared coolant reservoir 130 may be any container configured to hold coolant fluid. As noted above, coolant fluid may be any fluid configured to draw or remove heat from the heat-generating device 150 and/or the MIO layer 170. Non-limiting examples of the coolant fluid include dielectric coolant fluids such as aromatics, silicate-ester, aliphatics, silicones, fluorocarbons, and the like. The shared coolant reservoir 130 may define a plurality of openings for ingress and egress of coolant fluid into and out of the fluid reservoir. For example, and with reference to FIGS. 1 and 2, the shared fluid reservoir includes a first outlet 138 feeding coolant fluid into the passive heat exchange circuit 140 and a second outlet 136 feeding coolant fluid into the active heat exchange circuit 110. Additionally, the shared coolant reservoir 130 may include a first inlet 134 receiving coolant fluid from the passive heat exchange circuit 140 and a second inlet 132 receiving coolant fluid from the active heat exchange circuit 110. It is noted that though the inlets/outlets for the active and passive heat exchange circuits 110, 140 are illustrated on opposite sides of the shared coolant reservoir 130, it is contemplated the inlets and/or outlets may be positioned along any side of the shared coolant reservoir 130.

Each of the active and passive heat exchange circuits 110, 140 may include fluid flow paths 112, 142, respectively, that allow fluid to flow through each of the active and passive heat exchange circuits 110, 140. The fluid flow paths 112, 142 may interconnect the various components along the active and passive heat exchange circuits 110, 140 via tubing, piping, manifolds, etc. Each of the fluid flow paths 112, 142 are isolated from one another, which prevents undue pressure drops within the passive heat exchange circuit 140.

The active heat exchange circuit 110 may include a pump 114 and a heat exchanger 116 fluidically coupled to the pump 114. The pump 114 and the heat exchanger 116 may be fluidically coupled to one another over the fluid flow path 112. In some embodiments, the active heat exchange circuit 110 may be used to actively cool other components within the cooling assembly 100. For example, wherein the cooling assembly 100 is incorporated within a vehicle, the active heat exchange circuit 110 may be used to provide cooling fluid to a motor 120 and/or another heat-generating device (e.g., other electronics modules) within the vehicle.

Figure 4:
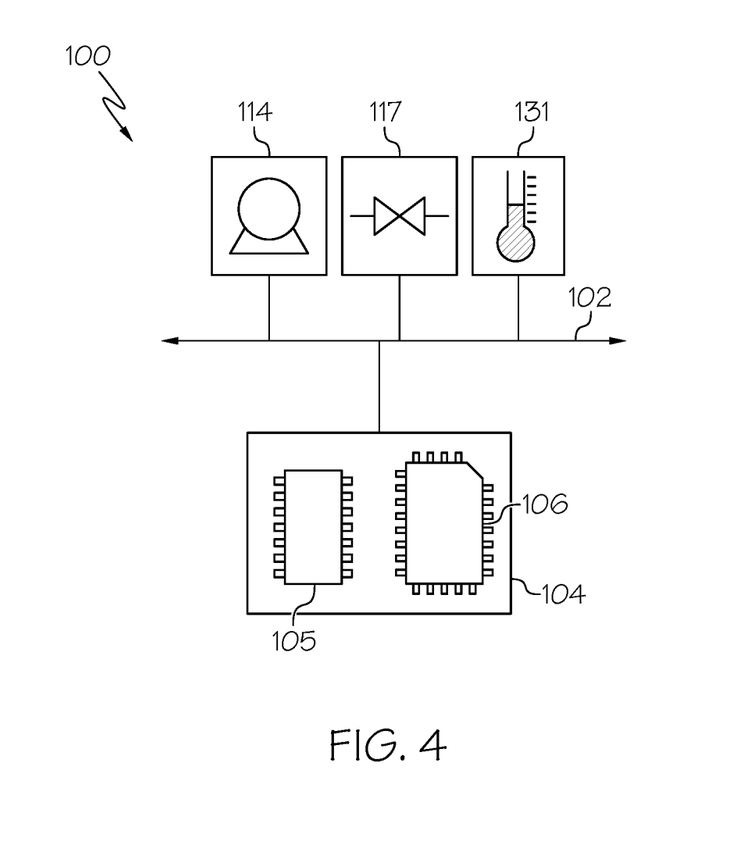
FIG. 4 schematically depicts communication between various modules of a cooling assembly according to any of the embodiments depicted in FIGS. 1-3, according to one or more embodiments shown and described herein.

Still referring to FIGS. 1-3, the pump 114 may be any type of pump configured to draw coolant fluid from the shared coolant reservoir 130 along the fluid flow path 112 of the active heat exchange circuit 110 and through the heat exchanger 116 to cool the coolant fluid. The pump 114 may be, for example, a mechanical or an electronic pump. In some embodiments, the pump 114 may constantly circulate coolant fluid through the active heat exchange circuit 110. However, in other embodiments, and as will be described in greater detail below, an electronic control unit 104 (as illustrated in FIG. 4) may periodically operate the pump 114 to selectively circulate coolant fluid through the active heat exchange circuit 110.

The heat exchanger 116 may be any heat exchanger configured to remove heat from coolant fluid being passed therethrough. For example, conventional heat exchangers 116 operate by transferring heat between two or more fluids while isolating each fluid from contact with one another. For example, the heat exchanger 116 may include a second fluid flow path 118 that circulates another coolant fluid through the heat exchanger 116. Passing of the two coolant fluids past one another exchanges heat from the coolant fluid within the active heat exchange circuit 110 to coolant fluid within the second fluid flow path 118. For example, the heat exchanger 116 may be a radiator or other heat exchanger of within a vehicle.

As noted above, the active heat exchange circuit 110 may be used to provide cooling fluid to a motor 120 (and/or another heat-generating device such as a battery of the vehicle). To actively cool the motor 120, the motor 120, or some portion thereof, may be fluidically coupled to the active heat exchange circuit 110 such that coolant fluid traveling through the active heat exchange circuit 110 cools the motor 120. For example, the motor 120 may include a cooling jacket surrounding the motor 120 that is part of the fluid flow path 112. The pump 114 may operate to draw fluid from the fluid outlet 136 of the shared coolant reservoir 130 along the fluid flow path 112 through the cooling jacket of the motor 120 to cool the motor 120. The pump 114 may continue to push the coolant fluid along the fluid flow path 112 through the heat exchanger 116 to cool the coolant fluid. In some embodiments, the coolant fluid may then directed back into the shared coolant reservoir 130 through the fluid inlet 132.

In some embodiments, such as illustrated in FIGS. 1 and 3, instead of being returned to the shared coolant reservoir 130, coolant fluid within the active heat exchange circuit 110 may continue to be circulated through the active heat exchange circuit, such that coolant fluid is routed around the shared coolant reservoir 130 through a bypass line 115. In such embodiments, a valve 117 (e.g., a control valve) may be controlled to be opened when it is desired that coolant fluid from the active heat exchange circuit 110 mix with coolant fluid within the shared coolant reservoir 130. When the valve 117 is closed, coolant fluid is directed through the bypass line 115 to allow the coolant fluid to bypass the shared coolant reservoir 130.

As illustrated in FIG. 2, in some embodiments there is no motor 120 or other heat-generating device that is cooled by the active heat exchange circuit 110. Instead, coolant fluid may be drawn from the shared coolant reservoir 130, passed through the heat exchanger 116, and returned to the shared coolant reservoir 130.

In either case, passing the coolant fluid through the active heat exchange circuit 110 causes the coolant fluid to be cooled by the heat exchanger 116. The coolant fluid may continue to circulate through the active heat exchange circuit 110 and/or returned to the shared coolant reservoir 130. By returning cooled coolant fluid to the shared coolant reservoir 130 the cooled coolant fluid within the shared coolant reservoir 130 may be combined with hot coolant fluid returning from the passive heat exchange circuit 140 to allow the temperature of coolant fluid within the shared coolant reservoir 130 to be maintained at a desired temperature to continue providing coolant fluid to the passive heat exchange circuit 140.

In some embodiments, a temperature sensor 131 may output a signal indicative of the temperature of coolant fluid within the shared coolant reservoir 130. With reference to FIG. 4, in such embodiments, the cooling assembly 100 may include a communication path 102, an electronic control unit 104, the pump 114, the temperature sensor 131, and/or the valve 117. Other modules may be included without departing from the scope of the present disclosure.

The communication path 102 provides data interconnectivity between various modules disposed within the cooling assembly 100. Specifically, each of the modules can operate as a node that may send and/or receive data. In some embodiments, the communication path 102 includes a conductive material that permits the transmission of electrical data signals to and between processors, memories, sensors, and valves, pumps, etc. throughout the cooling assembly 100. In another embodiment, the communication path 102 can be a bus, such as for example a LIN bus, a CAN bus, a VAN bus, and the like. In further embodiments, the communication path 102 may be wireless and/or an optical waveguide. Components that are communicatively coupled may include components capable of exchanging data signals with one another such as, for example, electrical signals via conductive medium, electromagnetic signals via air, optical signals via optical waveguides, and the like.

The electronic control unit 104 may be configured to selectively operate components of the cooling assembly 100. For example, the electronic control unit 104 may control the pump 114 and/or the valve 117 to selectively mix coolant fluid from the active heat exchange circuit 110 with coolant fluid from the passive heat exchange circuit 140 within the shared coolant reservoir 130. For example, the electronic control unit 104 may include one or more processors 105 and one or more memory modules 106. The one or more processors 105 may include any device capable of executing machine-readable instructions stored on a non-transitory computer-readable medium. Accordingly, each processor may include a controller, an integrated circuit, a microchip, a computer, and/or any other computing device. It is noted that the one or more processors 105 may reside within the cooling assembly 100 and/or external to the cooling assembly 100.

The one or more memory modules 106 are communicatively coupled to the one or more processors 105 over the communication path 102. The one or more memory modules 106 may be configured as volatile and/or nonvolatile memory and, as such, may include random access memory (including SRAM, DRAM, and/or other types of RAM), flash memory, secure digital (SD) memory, registers, compact discs (CD), digital versatile discs (DVD), and/or other types of non-transitory computer-readable mediums. Depending on the particular embodiment, these non-transitory computer-readable mediums may reside within the cooling assembly 100 and/or external to the cooling assembly 100. The one or more memory modules 106 may be configured to store one or more pieces of logic to selectively operate the pump 114 to circulate coolant fluid from the shared coolant reservoir 130 through the active heat exchange circuit 110. In some embodiments, the one or more memory modules 106 may be configured to store one or more pieces of logic to selectively operate the valve 117 to allow coolant fluid from the active heat exchange circuit 110 to enter the shared coolant reservoir 130.

Embodiments of the present disclosure include logic stored on the one or more memory modules 106 that includes machine-readable instructions and/or an algorithm written in any programming language of any generation (e.g., 1GL, 2GL, 3GL, 4GL, and/or 5GL) such as, machine language that may be directly executed by the one or more processors 105, assembly language, obstacle-oriented programming (OOP), scripting languages, microcode, etc., that may be compiled or assembled into machine readable instructions and stored on a machine readable medium. Similarly, the logic and/or algorithm may be written in a hardware description language (HDL), such as logic implemented via either a field-programmable gate array (FPGA) configuration or an application-specific integrated circuit (ASIC), and their equivalents. Accordingly, the logic may be implemented in any conventional computer programming language, as pre-programmed hardware elements, and/or as a combination of hardware and software components. As will be described in greater detail herein, logic stored on the one or more memory modules 106 allows the electronic control unit 104 to, for example, detect a temperature of coolant fluid within the shared coolant reservoir 130, by receiving a signal from the temperature sensor 131, and determining a temperature of coolant fluid within the shared coolant reservoir 130 based on the signal from the temperature sensor 131. In response to detecting the temperature of coolant fluid within the shared coolant reservoir 130, the electronic control unit 104 may direct coolant fluid from the active heat exchange circuit 110 into the shared coolant reservoir 130, to decrease a temperature of coolant fluid within the shared coolant reservoir 130.

The electronic control unit 104 may be configured to activate the pump 114 based on the detected temperature. For example, where the temperature of coolant fluid within the shared coolant reservoir 130 rises above a predetermined threshold (e.g., greater than or equal to about 60° C., greater than or equal to about 80° C., greater than or equal to about 100° C., or the like) the pump 114 may be activated by the electronic control unit 104 to circulate fluid through the active heat exchange circuit 110 to cool to coolant fluid and return the coolant fluid to the shared coolant reservoir 130. In some embodiments, when a temperature of the coolant fluid within the shared coolant reservoir 130 falls below a predetermined threshold (e.g., less than or equal to about 60° C., less than or equal to about 80° C., less than or equal to about 100° C., or the like), the electronic control unit 104 may stop operation of the pump 114 until the temperature of the coolant fluid within the shared coolant reservoir 130 again rises above the predetermined threshold.

In some embodiments, such as illustrated in FIGS. 1 and 3, coolant fluid within the active heat exchange circuit 110 may be constantly circulated and may bypass the shared coolant reservoir through the bypass line 115. The coolant fluid within the active heat exchange circuit 110 may be prevented from entering the shared coolant reservoir 130 while the valve 117 is in a closed position. Accordingly, when the valve 117 is in the closed position, coolant fluid within the shared coolant reservoir 130 may only be circulating through the passive heat exchange circuit 140. The electronic control unit 104 may be communicatively coupled to the valve 117 (e.g., an actuator of the valve) so as to control a movement of the valve 117 between the closed and open positions. The electronic control unit 104 may be configured to open and/or close the valve 117 in response to a detected temperature within the shared coolant reservoir and/or the passive heat exchange circuit 140. For example, once a temperature of coolant fluid within the passive heat exchange circuit 140 and/or the shared coolant reservoir 130 rises above a predetermined value (e.g., greater than or equal to about 60° C., greater than or equal to about 80° C., greater than or equal to about 100° C., or the like), the valve 117 may be triggered, by the electronic control unit 104, to open to admit coolant fluid from the active heat exchange circuit 110 to flow into the shared coolant reservoir 130 and mix with coolant fluid from the passive heat exchange circuit 140 to cool coolant fluid within the shared coolant reservoir 130. In some embodiments, when a temperature of the coolant fluid within the passive heat exchange circuit 140 and/or the shared coolant reservoir 130 falls below a predetermined threshold (e.g., less than or equal to about 60° C., less than or equal to about 80° C., less than or equal to about 100° C., or the like), the electronic control unit 104 may operate the valve 117 to close the valve 117, thereby isolating coolant fluid within the active heat exchange circuit 110 from returning to the shared coolant reservoir 130 until the temperature of the coolant fluid within the shared coolant reservoir 130 and/or the passive heat exchange circuit 140 again rises above the predetermined threshold.

Referring again to FIGS. 1-3 the passive heat exchange circuit 140 may include the fluid flow path 142, which directs coolant fluid through the MIO layer 170 and back to the shared coolant reservoir 130. The term "passive" refers to the flow of fluid without an active driving force, such as a pump. Instead, flow is facilitated by capillary pressure generated by the small pore size of the MIO layer 170. Referring specifically to FIGS. 1 and 2, the fluid flow path 142 may fluidically couple to first outlet 138 of the shared coolant reservoir 130 to an inlet side 173 of the MIO layer 170, such that the MIO layer 170 forms part of the fluid flow path 142. Additionally the fluid flow path 142 further fluidically couples an outlet side 174 of the MIO layer 170 to the first inlet 134 of the shared coolant reservoir 130. For example, coolant fluid may be introduced to an inlet side 173 of the MIO layer 170 using gravity and capillary forces. That is, cooling fluid may flow naturally from the shared coolant reservoir 130 to the MIO layer 170. As fluid is introduced into the MIO layer 170, heat from the heat-generating device 150 may cause the coolant fluid to evaporate. The evaporated coolant fluid may flow (e.g., via vapor space surrounding the MIO layer 170) back to the shared coolant reservoir 130 through the first fluid inlet 134 where it transitions back to a liquid coolant. By allowing coolant fluid to flow naturally through the MIO layer 170, large pressure drops within the cooling assembly 100 may be avoided, which may lead to overall better thermal management and energy savings by not requiring a pump to drive coolant fluid through the passive heat exchange circuit 140, which would need to compensate for pressure drops that would by caused by actively forcing fluid through the MIO layer 170.

Referring now to FIG. 3, in some embodiments, the MIO layer 170 may be bonded to the first surface 152 of the heat-generating device 150, instead of between the heat-generating device 150 and the bottom electrode 160, as illustrated in FIGS. 1 and 2. By bonding the MIO layer 170 to the first surface 152 the MIO layer 170 is positioned in closer proximity to the shared coolant reservoir 130 than the heat-generating device 150. Closer proximity of the MIO layer 170 to the shared coolant reservoir 130 may further reduce any pressure drops within the passive heat exchange circuit 140. In this embodiment, a central manifold 144 may be provided to more readily provide coolant fluid from the shared coolant reservoir 130 using gravity, for example to a top surface 175 of the MIO layer 170. In this embodiment, the passive heat exchange circuit 140 may return fluid to the shared coolant reservoir 130 at the first fluid inlet 134 and a third fluid inlet 139. In some embodiments, the central manifold 144 instead provide a return conduit for the return of coolant vapor to the shared coolant reservoir 130. In such embodiments, coolant fluid may be delivered to the MIO layer 170 via may flow path(s) 142. In some embodiments, an entire edge surface and/or some of the top surface 175 may be exposed to allow coolant fluid to return to the shared coolant reservoir 130. Accordingly, in this embodiment, additional surface area may be exposed to coolant fluid, thereby providing a greater area for bubbles to escape, which may also reduce any pressure drops within the passive heat exchange circuit 140.

Figure 5:
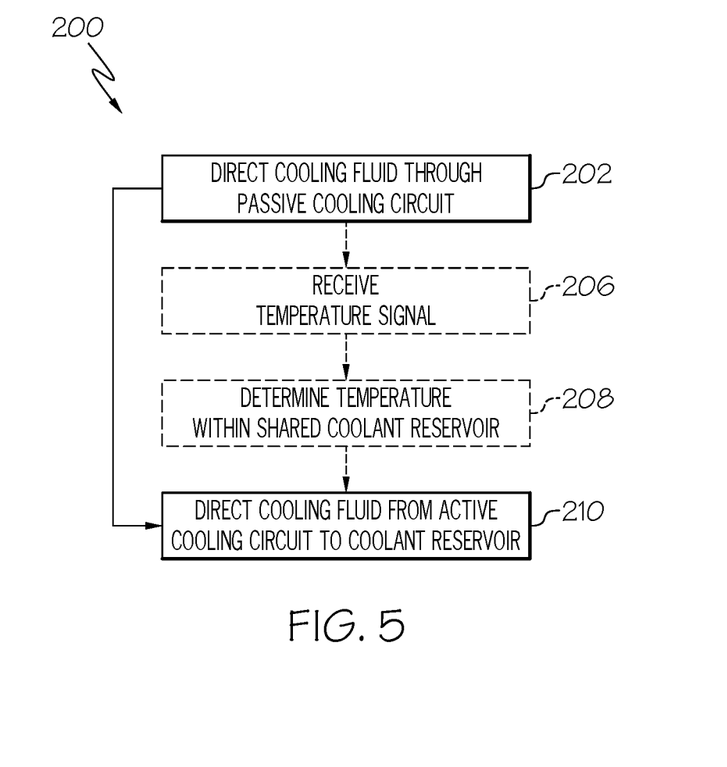
FIG. 5 depicts a flowchart illustrating a method for cooling a heat-generating device, according to one or more embodiments shown and described herein.

Referring now to FIG. 5, a flow chart depicting a method 200 of cooling the heat-generating device 150 with the various embodiments of a cooling assembly 100 is described. It is noted that though a particular number of steps are depicted in a particular order, a greater or fewer number of steps may be included, in any order, without departing from the scope of the present disclosure. At step 202, the method 200 includes directing coolant fluid through the passive heat exchange circuit 140. That is, fluid is passively directed from the shared coolant reservoir 130, through the MIO layer 170, where the coolant fluid may evaporate, and back to the shared coolant reservoir 130, where the coolant fluid may condensate.

At step 210, the method 200 includes directing coolant fluid through the active heat exchange circuit 110 to the shared coolant reservoir 130. For example, and as described above, coolant fluid is actively directed, with the pump 114, through the active heat exchange circuit 110 from the shared coolant reservoir 130, through the heat exchanger 116, and back into the shared coolant reservoir 130. In some embodiments, the pump 114 may be continuously active with the cooling assembly 100. That is, where the cooling assembly 100 is incorporated within a vehicle, the pump 114 may constantly circulate coolant fluid through the active cooling circuit. This may be especially advantageous where the active heat exchange circuit 110 is also cooling another heat-generating device such as a motor 120 of the vehicle. In such embodiments, coolant fluid within the active heat exchange circuit may be routed around the shared coolant reservoir 130, e.g., via the bypass line 115, until a temperature within the shared coolant reservoir 130 and/or the passive heat exchange circuit 140 reaches a predetermined temperature. In such embodiments, the valve 117 may be closed to prevent flow of coolant fluid within the active heat exchange circuit 110 into the shared coolant reservoir 130. The valve 117 may be opened by the electronic control unit 104 in response to a detected temperature of coolant fluid within the shared coolant reservoir 130 and/or the passive heat exchange circuit 140. For instance, in some embodiments the method 200 may include, at step 206, receiving a signal from the temperature sensor 131 with the electronic control unit 104, and, at step 208, determining, with the electronic control unit 104, a temperature of the coolant fluid within the shared coolant reservoir 130 and/or the passive heat exchange circuit 140 based on the signal from the temperature sensor 131. In such embodiments, the electronic control unit 104 may move the valve 117 to an open position to allow coolant fluid from the active heat exchange circuit to enter the shared coolant reservoir 130 when the temperature of the coolant fluid within the shared coolant reservoir 130 and/or the passive heat exchange circuit 140 is above a predetermined threshold (e.g., greater than or equal to about 60° C., greater than or equal to about 80° C., greater than or equal to about 100° C., or the like). Additionally, the electronic control unit 104 may move the valve 117 to a closed position when, based on the signal output by the temperature sensor 131, the temperature of the fluid coolant within the shared coolant reservoir 130 and/or the passive heat exchange circuit 140 is below the predetermined temperature (e.g., less than or equal to about 60° C., less than or equal to about 80° C., less than or equal to about 100° C., or the like).

In some embodiments, such as embodiments where there is not a valve 117 or a bypass line 115, the pump 114 may be only occasionally or periodically activated to circulate coolant fluid through the active heat exchange circuit 110. In such embodiments, the pump 114 may be activated to circulate coolant fluid through the coolant circuit when the temperature of the coolant fluid within the shared coolant reservoir 130 is above a predetermined threshold (e.g., greater than or equal to about 60° C., greater than or equal to about 80° C., greater than or equal to about 100° C., or the like). Additionally, the electronic control unit 104 may cease operation of the pump 114 when, based on the signal output by the temperature sensor 131, the temperature of the fluid coolant within the shared coolant reservoir 130 is below the predetermined temperature (e.g., less than or equal to about 60° C., less than or equal to about 80° C., less than or equal to about 100° C., or the like).

It is noted that while the various illustrations of example embodiments illustrate single-sided cooling (e.g., cooling fluid flows past one surface of the heat-generating device 150), embodiments may include double sided cooling, wherein coolant fluid is directed to both the first surface 152 and the second surface 154 of the heat-generating device 150. In such embodiments, there may be a first MIO layer positioned on the first surface 152 of the heat-generating device 150 and a second MIO layer positioned on the second surface of the heat-generating device 150 and the passive heat exchange circuit 140 may allow flow of coolant fluid through both the first MIO layer and the second MIO layer.

It should now be understood that embodiments as described herein are directed to cooling assemblies for cooling a heat-generating device. For example, cooling assemblies according to the present disclosure may include a heat-generating device, a porous metal inverse opal (MIO) layer, a shared coolant reservoir, a passive heat exchange circuit, and an active heat exchange circuit. The active heat exchange circuit may direct coolant fluid through a circuit via a pump, which replenishes coolant fluid by passing the coolant fluid through a heat exchanger. The passive coolant circuit may passively allow coolant to flow naturally through the MIO layer (e.g., via gravity and capillary force to draw the coolant fluid through the MIO layer) and thereafter return to the coolant reservoir, where it may be drawn into the active coolant circuit for cooling the coolant fluid. Accordingly, pressure drops, which may otherwise be experienced by pushing coolant fluid through an MIO layer with a pump, may be avoided, thereby increasing system cooling and energy consumption efficiencies.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling assembly comprising:
   a heat-generating device;
   a metal inverse opal (MIO) layer bonded to the heat-generating device;
   a shared coolant reservoir containing coolant fluid;
   a passive heat exchange circuit directing the coolant fluid from the shared coolant reservoir through the MIO layer and back to the shared coolant reservoir; and
   an active heat exchange circuit comprising a pump and a heat exchanger, wherein the active heat exchange circuit draws the coolant fluid from the shared coolant reservoir through the heat exchanger and returns the coolant fluid to the shared coolant reservoir.

2. The cooling assembly of claim 1, further comprising a copper electrode bonded to the MIO layer opposite the heat-generating device.

3. The cooling assembly of claim 1, further comprising a copper electrode bonded to the heat-generating device opposite the MIO layer.

4. The cooling assembly of claim 1, further comprising a motor fluidically coupled to the active heat exchange circuit such that the coolant fluid traveling through the active heat exchange circuit cools the motor.

5. The cooling assembly of claim 1, wherein the shared coolant reservoir comprises:
   a first outlet feeding the coolant fluid into the passive heat exchange circuit; and
   a second outlet feeding the coolant fluid into the active heat exchange circuit.

6. The cooling assembly of claim 1, wherein the shared coolant reservoir comprises:
   a first inlet receiving the coolant fluid from the passive heat exchange circuit; and
   a second inlet receiving the coolant fluid from the active heat exchange circuit.

7. The cooling assembly of claim 6, wherein the shared coolant reservoir comprises a third inlet receiving the coolant fluid from the passive heat exchange circuit.

8. A cooling assembly comprising:
   a heat-generating device;
   a metal inverse opal (MIO) layer bonded to the heat-generating device;
   a shared coolant reservoir containing coolant fluid;
   a temperature sensor configured to output a signal indicative of a temperature of the coolant fluid within the shared coolant reservoir;
   a passive heat exchange circuit directing the coolant fluid from the shared coolant reservoir through the MIO layer and back to the shared coolant reservoir;
   an active heat exchange circuit comprising a pump and a heat exchanger fluidically coupled to the pump, wherein the active heat exchange circuit draws the coolant fluid from the shared coolant reservoir through the heat exchanger and returns the coolant fluid to the shared coolant reservoir; and
   an electronic control unit configured to:
      detect the temperature of the coolant fluid within the shared coolant reservoir based on the signal from the temperature sensor; and direct the coolant fluid from the active heat exchange circuit to the shared coolant reservoir in response to the temperature of the coolant fluid within the shared coolant reservoir.

9. The cooling assembly of claim 8, wherein the electronic control unit activates the pump in response to detecting the temperature of the coolant fluid within the shared coolant reservoir of 60 C.° or more.

10. The cooling assembly of claim 8, wherein the active heat exchange circuit further comprises a valve communicatively coupled to the electronic control unit, wherein the electronic control unit is configured to open the valve to allow the coolant fluid from the active heat exchange circuit to flow into the shared coolant reservoir in response to detecting a threshold temperature of the coolant fluid within the shared cool reservoir.

11. The cooling assembly of claim 8, further comprising a copper electrode bonded to the heat-generating device opposite the MIO layer.

12. The cooling assembly of claim 8, wherein the shared coolant reservoir comprises:
a first outlet feeding the coolant fluid into the passive heat exchange circuit; and
a second outlet feeding the coolant fluid into the active heat exchange circuit.

13. The cooling assembly of claim 8, wherein the shared coolant reservoir comprises:
a first inlet receiving the coolant fluid from the passive heat exchange circuit; and
a second inlet receiving the coolant fluid from the active heat exchange circuit.

14. The cooling assembly of claim 13, wherein the shared coolant reservoir comprises a third inlet receiving the coolant fluid from the passive heat exchange circuit.

15. A method of cooling a heat-generating device comprises:
actively directing fluid through an active heat exchange circuit with a pump from a shared coolant reservoir, through a heat exchanger, and into the shared coolant reservoir; and
passively directing the fluid from the shared coolant reservoir through a passive heat exchange circuit such that coolant fluid is directed from the shared coolant reservoir through an MIO layer bonded to the heat-generating device and back to the shared coolant reservoir.

16. The method of claim 15, further comprising:
receiving a signal from a temperature sensor with an electronic control unit;
determining, with the electronic control unit, a temperature of the coolant fluid within the shared coolant reservoir based on the signal from the temperature sensor; and
activating, with the electronic control unit, the pump in response to the temperature of the coolant fluid within the shared coolant reservoir.

17. The method of claim 16, wherein the electronic control unit activates the pump in response to determining the temperature of the coolant fluid within the shared coolant reservoir is 60 C.° or greater.

18. The method of claim 15, wherein the shared coolant reservoir comprises:
a first outlet feeding the coolant fluid into the passive heat exchange circuit; and
a second outlet feeding the coolant fluid into the active heat exchange circuit.

19. The method of claim 15, wherein the shared coolant reservoir comprises:
a first inlet receiving the coolant fluid from the passive heat exchange circuit; and
a second inlet receiving the coolant fluid from the active heat exchange circuit.

20. The method of claim 19, wherein the shared coolant reservoir comprises a third inlet receiving the coolant fluid from the passive heat exchange circuit.

\* \* \* \* \*